(12) United States Patent
Feinberg et al.

(10) Patent No.: US 8,941,381 B2
(45) Date of Patent: Jan. 27, 2015

(54) MULTIPLICATIVE INCREASE IN MRI DATA ACQUISITION WITH MULTI-BAND RF EXCITATION PULSES IN A SIMULTANEOUS IMAGE REFOCUSING PULSE SEQUENCE

(76) Inventors: David Feinberg, Sebastapol, CA (US); Kamil Ugurbil, Minneapolis, MN (US)

( * ) Notice: Subject to any disclaimer, the term of this patent is extended or adjusted under 35 U.S.C. 154(b) by 574 days.

(21) Appl. No.: 13/118,179

(22) Filed: May 27, 2011

(65) Prior Publication Data
US 2012/0056620 A1    Mar. 8, 2012

Related U.S. Application Data

(60) Provisional application No. 61/349,528, filed on May 28, 2010.

(51) Int. Cl.
*G01R 33/561* (2006.01)
*G01R 33/483* (2006.01)

(52) U.S. Cl.
CPC ........ *G01R 33/4835* (2013.01); *G01R 33/5615* (2013.01); *G01R 33/561* (2013.01); *G01R 33/5611* (2013.01)
USPC .......................................... 324/309; 324/307

(58) Field of Classification Search
USPC .......................... 324/300–322; 600/407–435; 382/128–132
See application file for complete search history.

(56) References Cited

U.S. PATENT DOCUMENTS

| | | | |
|---|---|---|---|
| 5,446,384 A * | 8/1995 | Dumoulin | 324/307 |
| 5,532,596 A * | 7/1996 | Henning | 324/309 |
| 5,548,216 A * | 8/1996 | Dumoulin et al. | 324/309 |
| 5,865,747 A * | 2/1999 | Steckner | 600/413 |
| 6,614,225 B1 | 9/2003 | Feinberg | |
| 6,853,188 B2 * | 2/2005 | Feinberg et al. | 324/307 |
| 6,853,190 B2 * | 2/2005 | Nittka et al. | 324/309 |
| 7,307,420 B2 * | 12/2007 | Dumoulin | 324/309 |
| 7,603,157 B2 * | 10/2009 | Feiweier et al. | 600/410 |
| 7,843,195 B2 * | 11/2010 | Ruhm | 324/309 |
| 8,022,701 B2 * | 9/2011 | Chen et al. | 324/307 |
| 8,143,889 B2 * | 3/2012 | Jeong et al. | 324/309 |
| 8,395,385 B2 * | 3/2013 | Lee et al. | 324/307 |
| 8,405,395 B2 * | 3/2013 | Setsompop et al. | 324/309 |
| 8,432,165 B2 * | 4/2013 | Senften et al. | 324/307 |
| 8,664,954 B2 * | 3/2014 | Hetzer et al. | 324/309 |
| 8,781,197 B2 * | 7/2014 | Wang et al. | 382/131 |

(Continued)

OTHER PUBLICATIONS

Feinberg, D., et al. "Multiplex Echo Planer Imaging for Sub-Second Whole Brain FMRI and Fast Diffusion Imaging", PLoS vol. 5 Issue 12 pp. 1-9, Dec. 2010.

(Continued)

*Primary Examiner* — Melissa Koval
*Assistant Examiner* — Tiffany Fetzner
(74) *Attorney, Agent, or Firm* — Cooper & Dunham LLP (57) ABSTRACT

Disclosed are methods and systems for carrying out super-multiplexed magnetic resonance imaging that entwines techniques previously used individually and independently of each other in Simultaneous Echo (or Imaging) Refocusing (SER or SIR) and Multi-Band (MB) excitation, in a single pulse sequence that provides a multiplication rather than summation of desirable effects while suppressing undesirable effects of each of the techniques that previously were used independently.

20 Claims, 7 Drawing Sheets

(56) References Cited

U.S. PATENT DOCUMENTS

| | | | |
|---|---|---|---|
| 2003/0169042 A1* | 9/2003 | Feinberg et al. | 324/309 |
| 2005/0083054 A1* | 4/2005 | Feiweier et al. | 324/307 |
| 2009/0273345 A1* | 11/2009 | Ruhm | 324/309 |
| 2009/0278538 A1* | 11/2009 | Chen et al. | 324/309 |
| 2011/0044524 A1* | 2/2011 | Wang et al. | 382/131 |
| 2011/0254548 A1* | 10/2011 | Setsompop et al. | 324/309 |
| 2012/0013336 A1* | 1/2012 | Hetzer et al. | 324/309 |
| 2012/0056620 A1* | 3/2012 | Feinberg et al. | 324/309 |
| 2012/0319686 A1* | 12/2012 | Jesmanowicz et al. | 324/309 |
| 2013/0057280 A1* | 3/2013 | Feiweier | 324/309 |
| 2013/0057282 A1* | 3/2013 | Blumhagen et al. | 324/309 |
| 2013/0085379 A1* | 4/2013 | Feinberg | 600/419 |
| 2013/0099784 A1* | 4/2013 | Setsompop et al. | 324/309 |
| 2013/0181710 A1* | 7/2013 | Setsompop et al. | 324/309 |
| 2013/0271128 A1* | 10/2013 | Duerk et al. | 324/307 |
| 2013/0342200 A1* | 12/2013 | Ugurbil | 324/307 |
| 2013/0342206 A1* | 12/2013 | Ugurbil | 324/309 |
| 2014/0225612 A1* | 8/2014 | Polimeni et al. | 324/309 |

OTHER PUBLICATIONS

Feinberg, D., et al. "Simultaneous Echo Refocusing in EPI", Magn Reson Med Jul. 48(1):1-5 (2002).

Larkman DJ., et al. "Use of multicoil arrays for separation of signal from multiple slices simultaneously excited" J Magn Reson Imaging 13(2):313-317 (2001).

Moeller, S., et al. Multiband Multislice GE-EPI at 7 Tesla, With 16-Fold Acceleration Using Partial Parallel Imaging With Application to High Spatial and Temporal whole-Brain FMRI, Magnetic Resonance in Medicine pp. 1-10, Jan. 18, 2010.

Reese, T.G., et al. "Halving Imaging Time of Whole Brain Diffusion Spectrum Imaging and Diffusion Tractography Using Simultaneous Image Refocusing in EPI", J Magn Res Imaging 29:517-522 (2009).

Setsompop, K. "Blipped Caipirhina for simultaneous mutli-slice EPI with reduced g-factor penalty", Proc.Intl. Soc.Mag. Reson.Med. 18 (2010) "presented at society meeting that took place May 1-7, 2010, and believed included in abstracts made available no later than May 7, 2010".

* cited by examiner

...multiple frequency bands (-f, .., +2f) of slice selective excitation on Gs gradient.

MULTIPLICATIVE INCREASE IN MRI DATA ACQUISITION WITH MULTI-BAND RF EXCITATION PULSES IN A SIMULTANEOUS IMAGE REFOCUSING PULSE SEQUENCE

CROSS-REFERENCE TO RELATED APPLICATIONS

This application claims the benefit of U.S. Provisional Application No. 61/394,528 filed May 28, 2010, the entire contents of which is incorporated by reference herein.

FIELD

This patent specification pertains to magnetic resonance imaging (MRI) and specifically to MRI using fast data acquisition and thus rapid imaging.

BACKGROUND

In magnetic resonance imaging, both diffusion imaging and functional imaging can rely on image formation via the echo planar imaging (EPI) technique, or a closely related variant such as spiral sampling. Efforts have been made to improve EPI and, particularly, to increase data acquisition efficiency in EPI. One approach has been to time-multiplex MRI signals from different slices of the patient's body and another, independent approach has been to frequency-multiplex MRI signals from different slices.

BACKGROUND

Figure 5:
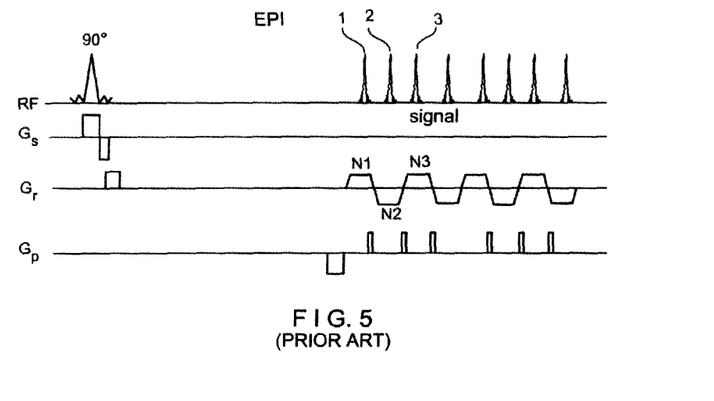
FIG. 5 illustrates a classical prior art spin echo pulse sequence with refocusing.
Figure 6:
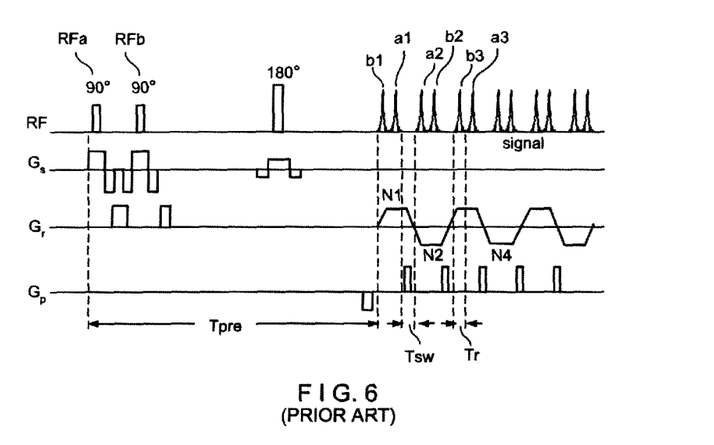
FIG. 6 illustrates a prior art SIR pulse sequence.

Time-multiplexing of MRI signals from different slices typically is called Simultaneous Echo Refocusing (SER) or Simultaneous Image Refocusing (SIR) EPI. Examples are described in (i) U.S. Pat. No. 6,614,225, (ii) Feinberg, D S, Reese T G, Wedeen V J, Simultaneous Echo Refocusing in EPI, Magn Res Med 48(1): 1-5 (2002), and (iii) Reese T G, Benner T, Wang R, Feinberg D A, and Wedeen V J, Halving Imaging Time of Whole Brain Diffusion Spectrum Imaging and Diffusion Tractography Using Simultaneous Image Refocusing in EPI, J Magn Res Imaging 29:517-522 (2009). The patent and the two articles cited in this paragraph are hereby incorporated by reference in this patent specification, as is every other patent and article cited elsewhere in this patent specification. FIG. 5 illustrates an example of a classical EPI pulse sequence, and FIG. 6 illustrates an example of a 2-slice SER pulse sequence, in each case showing pulses and time spacing that are not to scale. In the classical EPI example of FIG. 5, the 90° RF (radio frequency) pulse on the RF axis excites a slice in the body of a subject (e.g., a patient) in an imaging volume of an MRI scanner, according to the gradient pulses shown on the Gs axis. A train of MRI signals 1, 2, 3, . . . is emitted from the subject and read out with the help of a sequence of rephrasing gradient pulses, alternating in polarity, illustrated on the Gr axis and phase encoding gradient pulses illustrates on the Gp axis. The MRI signals are detected with one or more RF receiver coils, and the coil outputs are computer-processed to produce MRI image data for a k-space matrix and thereafter to produce an MRI image of the slice. In the 2-slice SIR example of FIG. 6, two RF pulses RFa and RFb are applied to the subject in time succession and, with the help of the gradient and 180° RF pulses illustrated in the preparatory time period Tpre, cause the patient to emit a time succession of N sets of two MRI signals (a) and (b) each. The first set comprises, in time sequence, MRI signal b1 and a1 for respective slices Sb and Sa of the subject, obtained in a single read interval N1; the second set comprises MRI signals a2 and b2 for the same two slices but in reverse order, obtained in a second read interval N2; the third set comprises signals b3 and a3, obtained in a read interval N3, etc. A rephrasing gradient shown on the gradient axis Gr alternates in polarity from one read interval N to the next, to thereby produce MRI signals for a total on N read intervals from the two RF pulses RFa and RFb, where N≥2. The two RF excitation pulses typically are 90° pulses that are slightly offset in frequency from each other. As a result, MRI echo signals are acquired from two slices in the time that a single echo MRI signal would be acquired absent the use of SIR. Thus, time-multiplexing of images in the readout periods N of SIR EPI increases data acquisition efficiency to thereby reduce average scan time, especially in diffusion imaging.

SIR data acquisition is impacted by the ratio of the preparatory time Tpre to the total MRI echo signal time. In one example, in an MRI data acquisition known as HARDI acquisition, the preparatory period Tpre is approximately 80 ms while the echo train is approximately 20 ms. The sharing of Tpre with two or more slices creates a large gain in sequence efficiency, defined here as net time of analog-to-digital (ADC) signal encoding per total sequence time. Another gain in efficiency in SIR is by the sharing of the many gradient switchings Tsw. Therefore scanners with slower slew rate or gradient ramp-time in their gradient systems (longer Tsw) also become more efficient with SIR, and similarly for lower resolution imaging (shorter repetition time TR relative to Tsw) efficiency and time savings increase. Despite the overall advantages of scan time reduction of SIR, the sampling time and echo spacing for each SIR slice are longer than for a classical EPI. The lengthening of the SIR echo train in the presence of local $T2^*$ (time constant for loss of phase coherence among spins oriented at an angle to the static magnetic field due to a combination of magnetic field inhomogeneities and the spin-spin relaxation) and Bo (static magnetic field) inhomogeneity increase image distortions to varying degrees but without losses in SNR (signal-to-noise ratio) provided the TE is unchanged in SIR EPI from classical EPI. In conditions requiring a minimum obtainable TE (echo time, or the time between the application of the 90° pulse and the peak of the echo signal in EPI) as in optimized diffusion imaging, the minimum TE of SIR is affected by the additional time of applying multiple excitation pulses plus the lengthened ADC read periods, and up to 10% SNR reduction has been found in SIR EPI. Using SIR in fMRI (functional MRI), there is no penalty in SNR as TE is typically lengthened from the minimally obtainable TE since BOLD (blood-oxygen level dependent) contrast is optimized when TE=$T2^*$.

A second approach, independent of SIR, involves frequency-multiplexing of images by combining excitation of slices at different off-resonance frequencies with subsequent de-multiplexing based on spatial sensitivity differences of RF receiver coils, a technique referred to as Multi-Band (MB) excitation. Examples of the MB approach are described in (i) Moller S, Auerbach E, van de Moortele P F, Adriany G, Ugurbil K, fMRI with 16-Fold reduction using multibanded multislice sampling, Proc. Int. Soc. Magn. Reson. In Med., 2008. 16: p. 2366, (ii) Moller S, Yacoub E, Olman C A, Auerbach E, Strupp J, Harel N, and Ugurbil K, Multiband Multislice GE-EPI at 7 Tesla, With 16-Fold Acceleration Using Partial Parallel Imaging With Application to High Spatial and Temporal While-Brain FMRI, (in press when the provisional application was filed, with a copy of the paper attached hereto and incorporated by reference herein; the published version is Feinberg D A, Moeller S, Smith S M, Auerbach E, Ramanna S, Glasser M F, Miller K L, Ugurbil K, and Yacoub E, Multiplexed Echo Planar Imaging for Sub-Second Whole Mrain fMRI and Fast Diffusion Imaging, PLoS, December 2010, volume 5, issue 12, e15710, pages 1-11), and (iii) Larkman D J, Hajnal J V, Herlihy A H, Coutts G A, Young I R, Ehnholm G. Use of multicoil arrays for separation of signal from multiple slices simultaneously excited. J Magn Reson Imaging 2001; 13(2):313-317. In MB excitation, increased efficiency is achieved by exciting several slices simultaneously. The MRI signals from those slices are unfolded using spatial encoding information present in RF receiver systems. Each of the several receiver coils yields a combination of MRI signals from all excited slices weighted by the sensitivity of the respective coil. A matrix inversion can provide a solution to unfold these signals so as to reconstruct MR images of the respective slices.

The MB acquisition of multiple slices at one time accelerates the volume coverage by the number of bands used in an MB RF excitation pulse (and thus the number of simultaneously excited and read out slices, and also results in reduced gradient demands and consequent reduced levels of acoustic noise for an un-accelerated acquisition of the same number of slices in which each slice is acquired separately. An MB MRI data acquisition technique available in MRI scanners from Siemens under the name SENSE provides a solution to aliasing. The separation of the aliased slice signals requires a different reference acquisition for GRAPPA (another pulse sequence provided by Siemens), but not for SENSE which directly separates aliased voxels. The two reconstructions have been shown to perform equally for GE (FLASH) imaging, but with GRAPPA being more desirable for high-field EPI imaging. The data size is reduced by a factor equal to the number of bands as several slices are contained within one matrix. Compared to equivalent multi-slice acquisitions needed to achieve the same number of slices, the repetition time TR is reduced by this same factor, allowing a larger number of slice images (and thus a better characterization of the temporal dynamics) to be acquired over the same time. Lastly, since each slice is excited and sampled identically, there is no significant SNR loss due to reduced data collection as is encountered with conventional parallel imaging along the phase encode direction, where under-sampling is used to accelerate the acquisition. There can be, however, SNR losses associated with separation of aliased image slices.

SUMMARY OF THE DISCLOSURE

Each of the SIR EPI and the MB MRI data acquisition techniques has advantages in reduction of acquisition time but also limitations on how many slices can be effectively imaged in one pulse sequence. For example, it was not contemplated that more than four slices could be effectively imaged in a single pulse sequence using SIR EPI, due manly to the lengthening of the readout time with the number of slices. And, it was not anticipated that the MB technique could effectively acquire much more than 4 images simultaneously due to limitations of coil sensitivity and due to increased SAR (Specific Absorption Rate) from the higher RF power in the banded RF pulses.

It has been discovered that, surprisingly, certain limitations of SIR MRI and of MB MRI are sufficiently independent of one another to make it possible to intertwine desirable characteristics of each in a single pulse sequence. Even more unexpectedly, the resulting new MRI data acquisition sequence does not lead to significant penalties in signal readout time lengthening or increases in SAR. It has been further discovered that while some of the respective limiting factors of known SIR and MB may increase by a small linear amount, there is a highly desirable and non-linear multiplicative increase in the number of resulting slice images when certain features previously used only in SIR or only in MB are entwined in the new method described in this patent specification.

This unanticipated large increase in the number of slice images, without incurring proportional increases in SAR or signal decay time, gives high value to the new imaging technology described here. The concurrent use of features from two very different multiplexing techniques in a single pulse sequence gives not a summation of their imaging speed effects but instead gives a multiplication of their acceleration factors, so that the average time of acquiring data for one slice image becomes divided by the product rather than the sum of the two accelerations. This is unlike acceleration such as by the techniques known as Partial Fourier and Parallel Imaging, which only reduce the time of the signal readout period and so reduce only a portion of the pulse sequence's total time and do not increase the number of image slices to be read out in the echo train, such that their combined effect is not as large, not much greater than a factor of 2 in imaging speed, particularly given the need for the specific image contrasts for BOLD and diffusion imaging that determine the minimum required TE.

With so many slice images that can be acquired, recorded and separated from each other with a single pulse sequence, practical applications to neuroscience and cardiac imaging can lead to a revolutionary changes in dynamic MRI imaging, where the temporal sampling frequency in the repeated scanning of the organ can now be increased by an order of magnitude beyond what is currently the fastest MRI technique known to be in clinical use. EPI is believed to be the fastest and most efficient imaging technique now used for dynamic measurements of BOLD fMRI in clinical practice, and for encoding hundreds of scans of the brain with different diffusional b-value weightings, or to make cine time series images of heart movement, or to measure the dynamic changes in a bolus of contrast passage through an organ to calculate blood perfusion. The vastly faster data acquisition described here is applicable to increasing the temporal sampling in these important physiological imaging techniques. The magnitude of the acceleration effect is astounding given the limitations of the existing SIR and MB multiplexing techniques and the lack of recognition that the distinctively different approaches to multiplexing, frequency vs. temporal, can in fact be mined for complementary aspects that do not compound their respective limiting constraints of SAR and signal decay, or cause these constraints to become additive, whereas the resulting net effect on imaging speed is a non-linear multiplicative increase. It also was unforeseen that both the temporal and frequency multiplexing of MRI signals could be demultiplexed from a single complex acquisition process. It was discovered that although the MRI signals that are both time-multiplexed and frequency multiplexed come out together and at once, they can be demultiplexed in two separate processes to separately bin in k-space the signals from each image plane.

In the method described in this patent specification, frequency and temporal multiplexing are intermingled in a single, super-multiplexed pulse sequence to give multiplicative increases in EPI imaging speed while maintaining image quality. SIR alone reduces the bandwidth of signal readout, causing increases in distortions, although this can be negated using parallel imaging to shorten the echo train. MB alone increases SAR, which can become prohibitive at high magnetic field human imaging.

The new approach of this patent specification applies three types of signal multiplexing, in a single pulse sequence such that SIR and MB features are used to multiplex images and Parallel Imaging is used to multiplex signals from within each image. The SIR multiplexing applies additional RF excitation pulses and records time-sequential MRI signals from different images. The RF excitation pulses in the super-multiplexed pulse sequence described here are different from those used in SIR multiplexing in that they are modified to have specific spatial frequencies to create multiple bands across physical space where NMR excitation occurs. Spatial sensitivity differences in RF receiver coils are used to separate the MRI signals from different excitation bands. M bands are excited in each banded excitation RF pulse and S of these M-banded RF excitation pulses are applied in time sequence within the same EPI pulse sequence, to thereby create MRI signals from M×S slice locations. Additional dephasing gradient pulses are applied between the M-banded pulses to temporally encode each group of M bands differently. In one example, the M bands are widely spaced to coincide with the spatial sensitivity of phased array receiver coils. The S slices within each M band are adjacent to each other so they fill up the spatial locations of planar volumes between the more widely separated M bands. The resulting S groups of signal are first separated by their timing in each refocused readout period of the EPI echo train. The M banded signals within each previously separated S demodulated signals are decoded using sensitivity differences of RF receiver coils to produce M images from each of the S groups of signals to give complete separation of M×S k-space data sets. Fourier reconstruction of 2D images can be used as known in MRI technology.

In a specific and non-limiting example, the new magnetic resonance imaging (MRI) method comprises (a) applying, to a subject in an MRI scanner, a set of S radio frequency (RF) excitation pulses in a time sequence, each pulse S being a multi-band pulse that simultaneously excites M slices, one in each of M volumes or bands in the subject, thereby causing the subject to emit, in a time sequence, S MRI signals, where S≥2 and M≥2, (b) refocusing to thereby generate a train of N sets of S MRI signals each, where N≥2, (c) acquiring the MRI signals with at least one RF receiver coil having spatial sensitivity characteristics, (d) computer-processing the MRI signals acquired with the at least one RF receiver coil to produce magnetic resonance image data for S×M slices of the subject; and (e) further computer-processing at least some of the image data to produce and display magnetic resonance images of at least some of the S×M slices of the subject. When S≥3 and M≥4, magnetic resonance image data for 12 or more slices of the subject are produced. The refocusing can use refocusing magnetic gradients alternating in polarity such that the MRI signals in each succeeding set of the N sets of S MRI signals each are time-ordered in a reverse of their order in the preceding one of said N sets. It is recognized here that instead of exciting M slices, the slice thickness can be made greater by using a weaker slice selective gradient to create thicker slabs and these slabs can be phase encoded with gradient pulses applied to two gradient axes, for which 3D FT produces a number T of images instead of an image of one slice, in which case MRI data for a total of M×S×T images are recorded in each pulse sequence. It is also recognized that the signals can be oriented differently in k-space, using radial k-space trajectories or sinusoidal or spiral k-space trajectories.

DETAILED DESCRIPTION OF PREFERRED EMBODIMENTS

In describing examples and preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Figure 1:
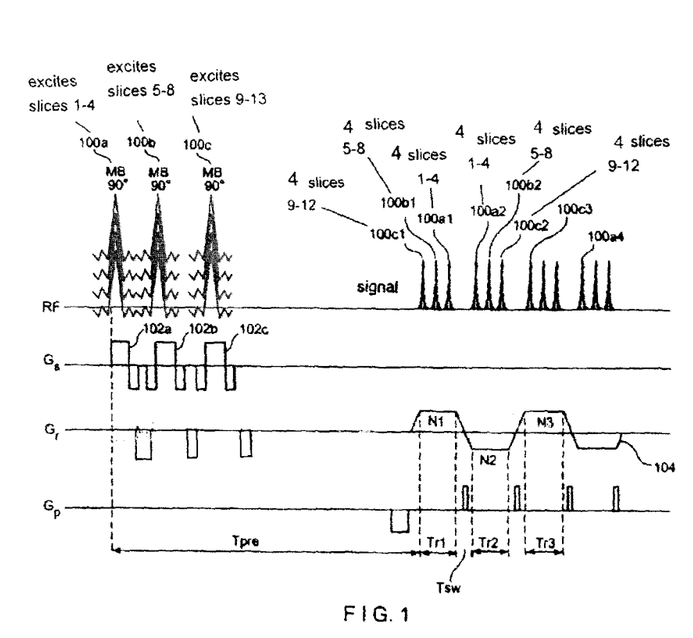
FIG. 1 illustrates and MRI super-multiplexed pulse sequence employing a new arrangement of certain features of Simultaneous Image Refocusing (SIR) MRI and Multi-Band (MB) MRI technologies.
Figure 1A:
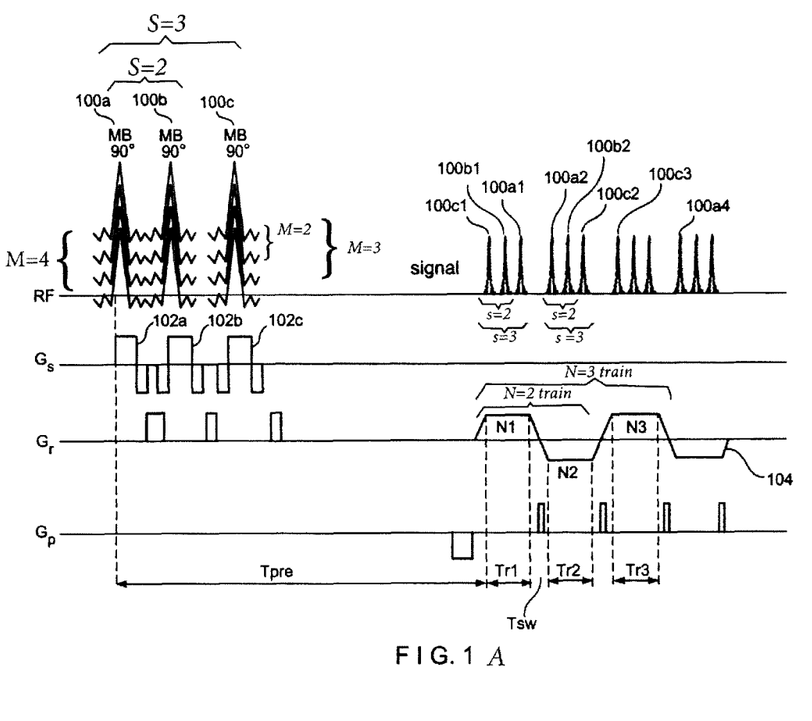
FIG. 1A shows the same pulse sequence except that it labels the pulses and frequency bands in an example where S=2, or 3 M=2, 3, or 4 and N=2 or 3.
Figure 2A:
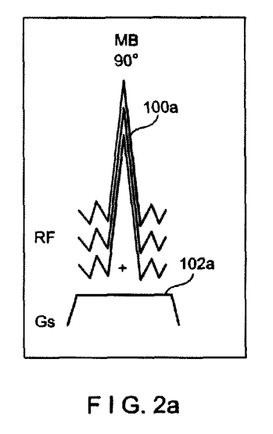
FIGS. 2a, 2b and 2c illustrate various aspects of the pulse sequence of FIG. 1 and its use.
Figure 2B:
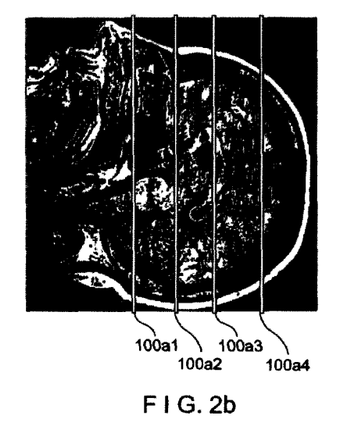
Figure 2C:
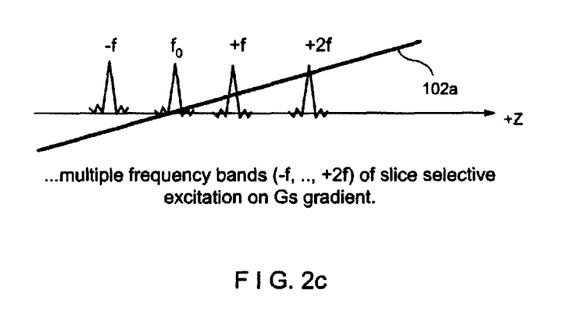

FIG. 1 illustrates an example of a super-multiplexed MRI pulse sequence using the principles described above, in which MRI image data can be acquired for a total of 12 slices of a subject in an MRI scanner. A first excitation pulse 100a, labeled "MB 90°," is a multi-band pulse that includes four frequency offsets, so that it contains excitation information for four different frequencies, slightly offset from each other as known in MB MRI, to excite four different volumes or bands in the subject. In combination with the concurrent gradient pulse illustrated on the Gs axis, RF pulse 100a excites four slices in the subject. This is illustrated in more detail in FIGS. 2a, 2b and 2c, where FIG. 2a illustrates RF excitation pulse 100a concurrent with the gradient pulse 102a on the Gs axis. FIG. 2b illustrates the four slices 100a1, 100a2, 100a3 and 100a4 in the head of a patient excited by the combination of pulses 100a and 102a. FIG. 2c illustrates the four frequency bands that are included in RF pulse 100a, in alignment with the slices in the patient's head that they excite. These frequencies are fo and three offsets from fo, one offset by an increment (−f), another offset by an increment (+f) and the third offset by an increment (+2f). FIG. 2c also illustrates the Gs gradient pulse 102a rising in the z-direction (along the length of the patient) from a magnetic field amplitude (−B) to (+B), so that the concurrence in time of the components of RF pulse 100a and slice select gradient pulse 102a excites the four slices seen in FIG. 2b.

Returning to FIG. 1, another RF excitation pulse 100b is applied to the subject in the MRI scanner after RF pulse 100a, concurrently with another magnetic gradient pulse 102b. Pulse 100b is otherwise similar to pulse 100a but differs in two important respects: (i) it is spaced in time from pulse 100a, and (ii) its base frequency content fo is slightly offset from the frequency content fo illustrated in FIG. 2c for pulse 100a. Because of this offset between the two base frequency contents fo of pulses 100a and 100b, the four slices in the subject's head that pulses 100b and 102b excite are offset in space from those excited by pulses 100a and 102a, so that now a total of 8 slices in the patient's head are excited. Later in time, RF pulse 100c and magnetic gradient pulse 102c are applied in a similar manner, except that the base frequency content of pulse 100c again is offset from those in pulses 100a and 100b such that an additional four slices of the patent's head are excited, for a total of 12 slices. Dephasing magnetic gradient pulses illustrated on the Gs axis in time period Tpre are used as is known in SIR technology.

After Tpre, a read gradient waveform is applied, alternating in polarity, so that three MRI signals 100c1, 100b1 and 100a1 are included in the first readout period Tr1, another three MRI signals are included in the second readout period Tr2 but in the reverse time order, another three MRI signals are included in the next readout period Tr3 but in a time order reversed from that in the preceding period Tr, and so on for a total of N readout periods Tr, with appropriate phase encoding as illustrated in the Gp axis. Thus, in this example, the pulse sequence illustrated in FIG. 1 applies to the subject a time sequence of S=3 RF excitation pulses 100a, 100b and 100c, each of said pulses being a multi-band pulse that simultaneously excites M=4 slices or bands in the subject, thereby causing the subject to emit, in a time sequence, S=3 MRI signals 100a1, 100b1 and 100c1, which MRI signals are refocused repeatedly to generate a train of N sets of three MRI signals each, containing MRI information from which MRI data can be derived for a total of S×N=12 slices in the subject, as described below.

Figure 3:
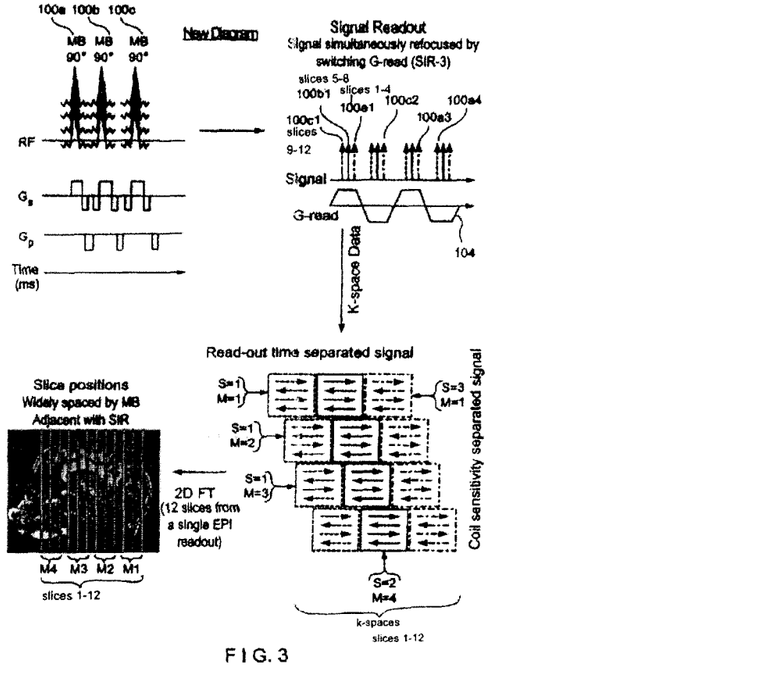
FIG. 3 includes certain portions of FIGS. 1 and 2a-2c and adds an illustration of using the super-multiplexed MRI signals to multiplicatively increase MRI signals acquisition speed and the number of slices compared to SIR and MB MRI.

FIG. 3 repeats some of the information of FIGS. 1 and 2a-2c but adds an illustration of how the MRI signals are used in this example to produce MRI data for 12 slices in the patient's head. In upper left, FIG. 3 shows the pulses seen in the Tpre time period of FIG. 1, and in upper right shows the MRI signals and the read magnetic gradient waveform 104 seen in the right hand portion of FIG. 1. The MRI signals are detected with an RF receiving coil system having spatial sensitivity characteristics and are computer-processed into k-space data populating a total of 12 k-space matrices, although only three RF excitation pulses were used in this example. The contents of the 12 k-space matrices are further computer-processed, for example using the two-dimensional Fourier Transform (2D FT) process known in MRI technology, to produce and, if desirable, display on a monitor, images of some or all of the 12 slices of the patient's head illustrated in lower left in FIG. 3. The 12 slices are in M=4 groups of S=3 images, where the location of each image is indicated by a respective vertical line over the image of the patient's head.

In populating the k-space matrices seen in FIG. 3, the horizontal selection of a matrix to populate within each row of k-space matrices is based on the time sequence of the MRI signals resulting from the three RF pulses 100a, 100b and 100c, while the selection of a row of k-space matrices is based on frequency demultiplexing of the information content of the MRI signals, using for example a matrix inversion process applied to MRI signals obtained with RF receiver coil systems of appropriate sensitivity differences as described in the articles cited in paragraph 005 above, which are incorporated by reference. Each of the rectangles in lower right represents a k-space matrix for a respective one of the S×M=12 slices. For example, the uppermost left rectangle represents the k-space for the slice corresponding to S=1, M=1, the next rectangle in the same row represents the k-space for the slice corresponding to S=2, M=1, and the rightmost rectangle in the same top row represents the k-space for the slice corresponding to S=3, M=1. The rectangles in the second row represent the k-spaces corresponding to the three S slices in the group where M=2, the rectangles in the third row represent the k-spaces corresponding to the three S slices in the group where M=3, and the rectangles in the fourth row represent the k-spaces corresponding to the three S slices in the group where M=4. The arrows in each k-space represent lines in k-space and the direction in which they are populated. As in known SIR MRI and in EPI, the successive lines in k-space are populated in opposite directions. Only a few lines (4 lines in this illustration) are in each k-space matrix, to show the principle, although typically there would be a much greater number of lines, such as 256 or 512 or some other number much greater than the illustrated 4 lines. Parallel Imaging would populate several of these lines in k-space. Preferably each of the 12 populated k-space matrices is converted to an MR image of a slice of the subject, although this is not necessary—some of the k-space matrices may be not be converted so no MR images are generated for the corresponding slices. Similarly, preferably all k-spaces (12 in this example) are populated with respective MRI signals, but this is not necessary—some may be left empty.

It is possible with this technique to obtain with current commercially available MRI hardware up to 12 fold reduction in the acquisition time of multi-slice 2D EPI covering the brain in approximately 200 milliseconds instead of 2.4 seconds. Twelve images can be recorded in approximately 50 milliseconds instead of a single image in about 40 milliseconds using a classical single echo train pulse sequence, also called single-shot EPI. The pulse sequence would then be repeated using different frequency offsets of the excitation RF pulses to record images at different spatial locations. Using four excitations of the pulse sequence, 12×4=48 images would be produced in 200 milliseconds, enough to cover all regions of the human brain, or other body regions. Different number of M bands and S simultaneously refocused images can be used to obtain a multiplicative number of slices in each echo train. It is possible to increase the M factor by designing phased array receiver coils with many rows of coils to encode many bands of excitation. It is also possible to increase the S factor by reducing the time between each of the S excitation pulses and by reducing the time between the S signals in each readout period to maintain the signal amplitude in the presence of T2 and T2* exponential decay parameters. Therefore it should be possible with further refinements that M=10 and S=10 could be used to give up to 10×10=100 images within a single echo train of EPI signals. This can be further improved by utilizing a parallel imaging reduction R-factor, to use multiple RF receiver coils within each banded region to reduce the number of required phase encoded signals to form each 2D image and to shorten the echo train so that T2 and T2* decay occurs over less time for maintaining higher signal amplitude. The use of higher S (greater number of time-sequenced excitation pulses) that will increase the time of the read period and concurrently increase the echo train time, can be compensated by increasing the parallel imaging reduction factor R. Therefore larger S parameter with larger R parameter in combination with M parameter will produce super-linear accelerations of the number of slices within an essentially unchanged echo train time. The higher signal bandwidth and signal-to-noise reductions known to occur with higher R parameter caused by incomplete decoupling of receiver coils and by the reduced number of acquired signals can lead to noise reductions upon averaging in Fourier Transform image reconstruction. The SNR can be increased and the frequency sensitivity improved in each coil by using higher Bo magnetic field for MRI, currently up to 7 Tesla compared to more widely available MRI scanners of 1.5 Tesla and 3.0 Tesla field strength.

The Multiplexed EPI principles described here can be extended to obtaining 3D FT images instead of 2D FT images and also can be used with multi-shot segmented data acquisition methods instead of single-shot data acquisition pulse sequences. The new method can be used with SE EPI utilizing M bands within the refocusing RF pulse in addition to the described technology.

One of the biggest technical challenges facing diffusion and functional MR imaging concerns the safety limitations imposed on the MR hardware so that the research subject or patient is not harmed. Specifically, the two major areas of concern are tissue heating arising from RF energy absorption (as quantified by the specific absorption rate, SAR) and nerve stimulation arising from the slope of switched gradient fields, dB/dt. Some modern scanners are already operated at the SAR and dB/dt limits that can be tolerated by humans. Therefore, in order to derive better spatial or temporal resolution from MRI scans, or to reduce examination times, it is important to design pulse sequences that optimize image acquisitions using the hardware available. The new method described here can provide significant advances in terms of imaging speed for both diffusion and functional neuroimaging, utilizing twin approaches to multiplexing that can be combined into a single, ultra-fast method.

Functional MRI (fMRI) based on blood oxygenation changes and measured using a gradient echo (GE) EPI sequence is now a commonly applied method to functional neuroimaging. Using the most modern generally available hardware at 3 T, such as with a 32-channel receive-only phased array head coil, coupled with the most advanced pulse sequences presently generally available, with parallel imaging, still limits the performance of GE-EPI to around 2 mm spatial resolution with whole brain coverage in about two seconds. For conventional event-related fMRI analyses these performance specifications may be adequate because the hemodynamic response to neuronal activation is "low-pass filtered," peaking perhaps some five to six seconds after the stimulus event. Thus, with a TR=2 sec the Nyquist condition should be satisfied. However, there are confounding physiological fluctuations, most notably brain pulsation coupled to the cardiac cycle, that occur at frequencies faster than 0.5 Hz. Any method that can maintain spatial resolution while improving temporal resolution has the potential to allow increased statistical power in an event-related fMRI scan, thus reducing the number of stimulus trials needed and reducing the scan duration. Furthermore, new 'data-driven' analysis methods are now replacing static mapping of activation locations with functional causality maps, the idea being to establish the temporal order in which brain regions are engaged in a particular task. Methods aimed at mapping causality, or any form of temporal information, benefit greatly from increased digitization, i.e. the largest degree of sampling per unit time. This can reduce artifacts, e.g. reduce ringing after Fourier transformation of a voxelwise time series data set, as well as improve the discriminating power between two events that are temporally close; while fMRI signals are inherently low-pass filtered by several seconds, there is a preservation of timing information as low as hundreds of milliseconds.

The Multiplexed-EPI variants of GE-EPI can permit significant gains in the temporal resolution of fMRI sampling rate in the data time series without any significant penalties in terms of spatial resolution. Using the lowest S and M factors of two for each and combining them will permit whole brain coverage with high spatial resolution of up to 2 mm in a greatly reduced TR of about 500 ms at 3 T. This four-fold acceleration means that cardiac fluctuations would no longer alias, and there can be improved precision for advanced time series analyses, such as Granger causality. The temporal sampling rate arguments pertain to high field fMRI also but at 7 T there are also large increases in contrast-to-noise ratio CNR and in BOLD contrast for a super-linear increase in sensitivity and CNR of functional signal of the brain.

The method described here therefore would reduce the overall acquisition time of multi-slice 2D EPI or other 2D multi-slice MRI techniques including those known as RARE and GRASE by means of intermixing features of two different multiplexing schemes such that super-linear increases obtain in imaging speed, as illustrated in FIG. 3 for the example of S=3 and M=4. Of course, a selection of S>3 and/or M>4 can be made within the principles of the new method.

Figure 4:
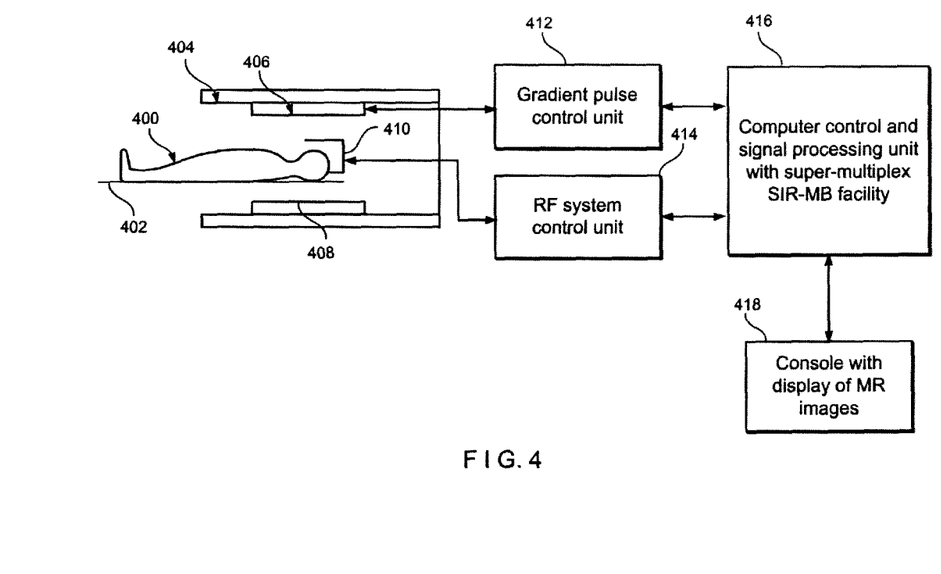
FIG. 4 is a block diagram illustrating an MRI system using the new, super-multiplexed pulse sequence of FIG. 1.

FIG. 4 illustrates in block diagram form an MRI scanner system performing an example of the new method. A patient 400 is on a patient support 402 of an MRI scanner 404 such that the anatomy of interest, e.g., the patient's head, is in an imaging volume of the scanner established by a source 406 of a steady magnetic field Bo, which can be a superconducting or other magnet. Schematically illustrated gradient coils 408 (including under Bo source 406) are pulsed with the magnetic gradient pulses discussed above that are illustrated on the Gs, Gr and Gp axis of FIG. 1, and an RF coil system 410 applies the RF excitation pulses and receives the MRI signals illustrated on the RF axis of FIG. 1. The RF coil system can comprise sending coils and one or more receiving coils having sensitivity characteristics suitable to MB MRI imaging. The gradient coils 408 are powered and controlled through gradient pulse control unit 412 to generate the required gradient field pulses and the RF coil system 410 is controlled by an RF system pulse control unit 414 to apply the required RF excitation pulses and receive and digitize the MRI signals. Each of units 412 and 414 is in turn in communication with a computer control and signal processing unit 416 that operates in accordance with an MRI pulse sequence conforming to the new super-multiplexed SIR-MB pulse sequence described in this patent specification to cause the generation of the required RF excitation pulses and magnetic gradient pulses and to receive and computer-process the MRI signals according to the method described above. A console 418 communicates with computer control 418 to initiate or otherwise control MRI sequences, including a sequence according to the new method described above, and display MRI slice images.

Thus, an example of the magnetic resonance imaging (MRI) method described above comprises the steps of: (i) applying, to a subject in an MRI scanner, a set of S radiofrequency (RF) excitation pulses in a time sequence, each pulse S being a multi-band pulse that simultaneously excites M respective slices in each of M volumes of the subject, thereby causing the subject to emit, in a time sequence, S MRI signals, where S≥2 and M≥2, but preferably S>2 and M>2; (ii) refocusing the signals to thereby generate a train of N sets of S MRI signals each, where N≥2, but preferably N>2; (iii) acquiring the MRI signals with at least one RF receiver coils having spatial sensitivity characteristics; (iv) computer-processing the MRI signals acquired with said RF receiver coils to produce magnetic resonance image data for S×M slices of the subject; and (v) further computer-processing at least some of said image data to produce and display magnetic resonance images of at least some of said S×M slices of the subject. In the method, when S≥3 and M≥4, and the computer-processing can produce magnetic resonance image data for 12 slices of the subject, and preferably no less that (S+M+1) slices. The refocusing preferably is carried out using refocusing gradients alternating in polarity such that the MRI signals in each succeeding set of said N sets of S MRI signals each are time-ordered in a reverse of the order in the preceding one of said N sets.

In another example, this patent specification describes an MRI scanner system comprising (i) an MRI scanner having a source of a steady magnetic field Bo, sources of gradient magnetic fields acting on a subject in an imaging volume of the MRI scanner, and an RF system selectively applying RF excitation pulses to the subject and receiving MRI signals from the subject in response thereto; (ii) a control and signal processing computer system coupled with said RF system and said sources of gradient fields, said computer system being configured to: (a) apply to said subject, through said RF system, a set of S radiofrequency (RF) excitation pulses in a time sequence, each pulse S being a multi-band pulse that simultaneously excites M respective slices in each of M volumes of the subject, thereby causing the subject to emit, in a time sequence, S MRI signals, where S≥2 and M≥2, but preferably S>2 and M>2; (b) refocus the signals, through said sources of gradient pulses, to thereby generate a train of N sets of S MRI signals each, where N≥2, but preferably N>2; (c) acquire the MRI signals through said RF system with spatial sensitivities encoded in the acquired MRI signals; and (d) computer-process the MRI signals acquired through said RF system to produce magnetic resonance image data for more than S+M but no more than S×M slices of the subject. Either the computer system or a separate console couples therewith can receive therefrom and further process said magnetic resonance image data and display MRI images based thereon on a monitor.

Yet another example of the new approach described above can be embodied in a computer program product stored on a computer-readable medium in non-transitory form which, when loaded on and executed with an MRI scanner system comprising an MRI scanner having a source of a steady magnetic field Bo, sources of gradient magnetic fields acting on a subject in an imaging volume of the MRI scanner, and an RF system selectively applying RF excitation pulses to the subject and receiving MRI signals from the subject in response thereto, causes the system to carry out the steps of: (i) applying to said subject, through said RF system, a set of S radiofrequency (RF) excitation pulses in a time sequence, each pulse S being a multi-band pulse that simultaneously excites M respective slices in each of M volumes of the subject, thereby causing the subject to emit, in a time sequence, S MRI signals, where S≥2 and M≥2, but preferably S>2 and M>2; (ii) refocusing the signals, through said sources of gradient pulses, to thereby generate a train of N sets of S MRI signals each, where N≥2, but preferably N>2; (iii) acquiring the MRI signals through said RF system with spatial sensitivities encoded in the acquired MRI signals; (iv) computer-process the MRI signals acquired through said RF system to produce magnetic resonance image data for more than S+M but no more than S×M slices of the subject; and (v) further computer-process said magnetic resonance image data and display MRI images based thereon on a monitor.

The above specific examples and embodiments are illustrative, and many variations can be introduced on these examples and embodiments without departing from the spirit and scope of the disclosure. For example, elements and/or features of different illustrative embodiments may be combined with each other and/or substituted for each other within the scope of this disclosure.

An Abstract that is believed to have been included in a book of abstracts on May 1, 2010 and presented at a conference a few days later, perhaps on May 4, 2010, is believed to include a description having certain similarities to the super-multiplexed technique described above. The abstract is: Setsompop K, Gagoski B A, Polimeni J, Witzel T, Wedeen V J, and Wald L L, Blipped CAIPARHINA for simultaneous multi-slice EPI with reduced g-factor penalty, Proc. Intl. Soc. Mag. Reson. Med 18 (2010), page 551. The provisional application the benefit of which this patent application claims was filed on May 28, 2010, but the invention claimed in this application was made before the Abstract.

Figure 7:
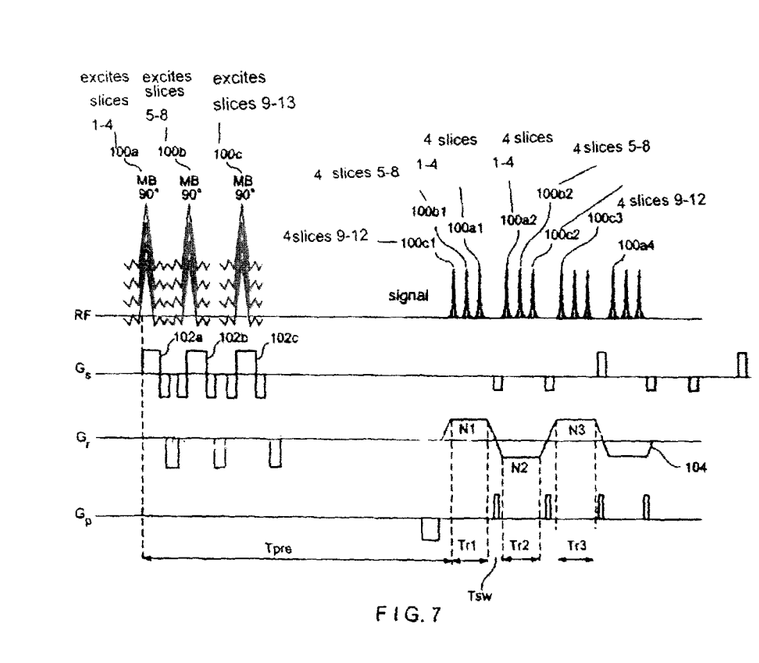
FIG. 7 illustrates the pulse sequence of FIG. 1 with several more gradient pulses being added on the Gs axis.

If pulses similar to those proposed in said Abstract are added to the super-multiplexed pulse sequence of FIG. 1 in this patent specification, the result is a sequence illustrated in FIG. 7, which includes all of the information of FIG. 1 and, in addition, several more gradient pulses on the Gs axis. As evident from FIGS. 1 and 7, the sequence of FIG. 7 still uses the entire method illustrated in FIG. 1.

What is claimed is:

1. A magnetic resonance imaging (MRI) method in which frequency and temporal multiplexing are intermingled in a single, super-multiplexed EPI sequence in order to give multiplicative increases in EPI imaging speed while maintaining image quality, comprising:

applying, to a subject in an MRI scanner, a set of S radiofrequency (RF) excitation pulses in a time sequence, each of the S pulses in the set of RF excitation pulses being a multi-band pulse of M different frequency bands that simultaneously excites M respective slices in corresponding volumes of the subject, thereby causing the subject to emit, in a time sequence, S MRI signals for each of the M slices, producing data for S×M slices, where S≥2 and M≥2 and each of the pulses in the set of RF excitation pulses has a base frequency offset from that of each other pulse in the set of RF excitation pulses in order to offset in space the slices excited by one of the RF excitation pulses from the slices excited by other RF excitation pulses;

simultaneously refocusing the MRI signals to thereby generate a train of N sets of S MRI signals each, where N≥2;

wherein each of S, M, and N is a positive integer;

acquiring the MRI signals with at least a RF receiver system having spatial sensitivity characteristics;

computer-processing the MRI signals acquired with said RF receiver system in order to produce magnetic resonance image data for each of the S×M slices of the subject; and further computer-processing at least some of said magnetic resonance image data in order to produce magnetic resonance images of at least some of said S×M slices of the subject.

2. The method of claim 1 including parallel imaging in order to multiplex MRI signals.

3. The method of claim 1 including displaying magnetic resonance images of at least some of said S×M slices of the subject at a display.

4. The method of claim 1 including utilizing said produced magnetic resonance images in functional MRI (fMRI) studies.

5. The method of claim 1 in which S>2.

6. The method of claim 2 in which M>2.

7. The method of claim 3 in which N>2.

8. A magnetic resonance (MRI) scanner system in which frequency and temporal multiplexing are intermingled in a single, super-multiplexed EPI sequence in order to give multiplicative increases in EPI imaging speed while maintaining image quality, comprising:

an MRI scanner having a source of a steady magnetic field Bo, sources of gradient magnetic fields acting on an imaging volume of the MRI scanner configured for containing a subject, and an RF system selectively applying RF excitation pulses into the imaging space and receiving MRI signals from the imaging space and subject therein in response thereto;

a control and signal processing computer system coupled with said RF system and said sources of gradient fields, said computer system being configured to cause said MRI scanner to:

apply to said imaging space and subject therein, through said RF system, a set of S radiofrequency (RF) excitation pulses in a time sequence, each of the S pulses in the set of RF excitation pulses being a multi-band pulse of M different frequency bands that simultaneously excites M respective slices in corresponding volumes of the imaging space and subject therein, thereby causing the imaging space and subject to emit, in a time sequence, S MRI signals for each of the M slices, producing data for S×M slices, where S≥2 and M≥2, and each of the pulses in the set of RF excitation pulses has a base frequency offset from that of each other pulse in the set of RF excitation pulses in order to offset in space the slices excited by one of the RF excitation pulses from the slices excited by other RF excitation pulses;

simultaneously refocus the MRI signals, through said sources of gradient pulses, in order to thereby generate a train of N sets of S MRI signals each, where N≥2;

wherein each of S, M, and N is a positive integer;

acquire the MRI signals through said RF system with spatial sensitivities encoded in the acquired MRI signals; and computer-process the MRI signals acquired through said RF system in order to produce magnetic resonance image data for at least S+M but no more than S×M slices of the imaging space and subject.

9. The system of claim 8 in which said computer system is further configured to carry out parallel imaging.

10. The system of claim 8 including a computer image display, and in which said computer system is further configured to display magnetic resonance images of at least some of said S×M slices of the subject at the display.

11. The system of claim 8 in which S>2.

12. The system of claim 11 in which M>2.

13. The system of claim 8 in which N>2.

14. A computer program product comprising computer-readable programs stored on a computer-readable medium in a non-transitory form which, when loaded on and executed with an MRI scanner system comprising an MRI scanner having a source of a steady magnetic field Bo, sources of gradient magnetic fields acting on a subject in an imaging volume of the MRI scanner, and an RF system selectively applying RF excitation pulses into the subject and receiving MRI signals from the subject in response thereto, causes the MRI scanner system in order to carry out a process in which frequency and temporal multiplexing are intermingled in a single, super-multiplexed EPI sequence in order to give multiplicative increases in EPI imaging speed while maintaining image quality, comprising the steps of:

applying to said subject, through said RF system, a set of S radiofrequency (RF) excitation pulses in a time sequence, each of the S pulses in the set of RF excitation pulses being a multi-band pulse of M different frequency bands that simultaneously excites M respective slices in corresponding volumes in the subject, thereby causing the subject to emit, in a time sequence, S MRI signals for each of the M slices, producing data for S×M slices, where S≥2 and M≥2, and each of the pulses in the set of RF excitation pulses has a base frequency offset from that of each other pulse in the set of RF excitation pulses in order to offset in space the slices excited by one of the RF excitation pulses from the slices excited by other RF excitation pulses;

wherein each of S, M, and N is a positive integer;

simultaneously refocusing the signals, through said sources of gradient pulses, in order to thereby generate a train of N sets of S MRI signals each, where N≥2;

acquiring the MRI signals through said RF system with spatial sensitivities encoded in the acquired MRI signals; and computer-processing the MRI signals acquired through said RF system in order to produce magnetic resonance image data for at least S+M but no more than S×M slices of the subject.

15. The computer program product of claim 14 wherein said programs cause the MRI scanner system to computer-process said magnetic resonance image data into images for display and to display MRI images based thereon on a computer monitor.

16. The computer program product of claim 14 in which said programs cause the MRI scanner system to carry out parallel imaging.

17. The computer program product of claim 14 in which S>2.

18. The computer program product of claim 17 in which M>2.

19. The computer program product of claim 14 in which N>2.

20. The computer-program product of claim 14 in which said programs cause the scanner system to provide functional MRI (fMRI) data.

* * * * *